(12) United States Patent
Piesinger

(10) Patent No.: US 8,570,024 B1
(45) Date of Patent: Oct. 29, 2013

(54) NON-CONTACT PHASE IDENTIFICATION METHOD AND APPARATUS

(76) Inventor: Gregory Hubert Piesinger, Cave Creek, AZ (US)

( * ) Notice: Subject to any disclaimer, the term of this patent is extended or adjusted under 35 U.S.C. 154(b) by 452 days.

(21) Appl. No.: 12/932,241

(22) Filed: Feb. 22, 2011

Related U.S. Application Data

(60) Provisional application No. 61/338,910, filed on Feb. 24, 2010.

(51) Int. Cl.
*G01R 19/00* (2006.01)

(52) U.S. Cl.
USPC ............... 324/67; 324/66; 324/86; 702/72; 702/188

(58) Field of Classification Search
USPC ............. 324/66, 67, 86; 702/72, 188
See application file for complete search history.

(56) References Cited

U.S. PATENT DOCUMENTS

| | | | | |
|---|---|---|---|---|
| 6,470,283 | B1 * | 10/2002 | Edel | 702/64 |
| 6,667,610 | B2 * | 12/2003 | Piesinger | 324/66 |
| 7,031,859 | B2 * | 4/2006 | Piesinger | 702/72 |
| 8,013,592 | B2 * | 9/2011 | Giubbini et al. | 324/76.77 |
| 2011/0130992 | A1 * | 6/2011 | Kolwalkar et al. | 702/72 |

* cited by examiner

*Primary Examiner* — Patrick Assouad
*Assistant Examiner* — Sean Curtis

(57) ABSTRACT

A phase identification system identifies the unknown phase attribute of any energized conductor within a three-phase power distribution network by comparing remote location non-contact phase identification instrument phase measurements to phase measurements taken at a reference location. The vector sum of three-phase conductor voltages at the remote measurement location are used to determine the near, center, and far conductor phase attributes of the three-phase lines being measured. This allows phase attributes of high overhead conductors to be determined from ground level using a non-contact handheld instrument.

20 Claims, 17 Drawing Sheets

HV = HIGH VOLTAGE SUBSTATION TRANSFORMER
TS = TRANSMISSION SUBSTATION TRANSFORMER
DS = DISTRIBUTION SUBSTATION TRANSFORMER
PM = POLE OR PAD MOUNT TRANSFORMER

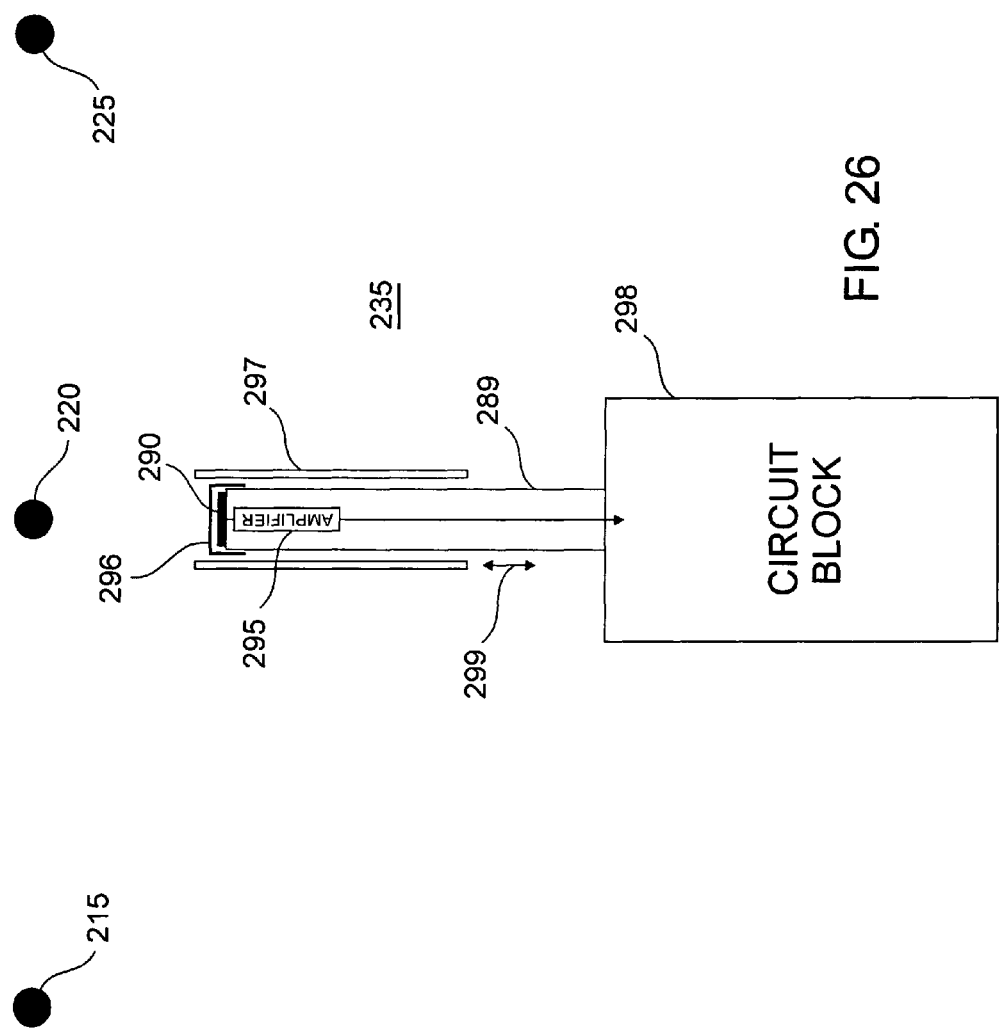

NON-CONTACT PHASE IDENTIFICATION METHOD AND APPARATUS

RELATED INVENTION

The present invention claims priority under 35 U.S.C. §119 (e) to: "Non-Contact Phase Identification Method and Apparatus" Provisional U.S. Patent Application Ser. No. 61/338,910, filed 24 Feb. 2010 which is incorporated by reference herein.

TECHNICAL FIELD OF THE INVENTION

The present invention relates to the field of three-phase power distribution networks. More specifically, the present invention relates to the field of identifying the phase of a conductor in a three-phase power distribution network.

BACKGROUND OF THE INVENTION

Electric power distribution networks are used by the electric utilities to deliver electricity from generating plants to customers. Although the actual distribution voltages will vary from utility to utility, in a typical network, three-phase power at high voltage 345,000 volts phase-to-phase (345 KV) is delivered to multiple high voltage substations at which transformers step this high voltage down to a lower three-phase voltage 115 KV. Multiple transmission substations further lower this voltage to 69 KV. This 69 KV three-phase power then feeds multiple distribution substations whose transformers further step down this voltage to distribution voltage (12,470 volts phase-to-phase) and separate power into three single-phase feeder cables. Typically, these feeder cables operate at 7,200 volts phase-to-ground. Each of these feeder cables branch into multiple circuits to power a plurality of local pole-mounted or pad-mounted transformers which step the voltage down to a final voltage of 120 and 240 volts for delivery to commercial and residential customers.

The instantaneous phases of the three conductors in a three-phase system are separated by 120 degrees. A phase attribute of A, B, or C is typically assigned to each of the three conductors to identify them. The initial assignment of phase attribute to each of the three conductors typically takes place at a transmission or distribution substation and this assignment is somewhat arbitrary. The attributes assigned at the substations become known as the tagging reference phases for that substation because the goal is to consistently tag, mark, or identify each conductor with its proper phase attribute throughout the substation's distribution region.

Utilities have many reasons for accurately identifying the phase of each conductor in their utility. Examples are load balancing to reduce neutral current flow, faster service restoration after outages, and for distribution automation purposes.

Most currently available phase identification instruments use GPS timing signals to obtain instantaneous phase measurements at a reference location and field location at the same instant of time. The phase attribute at the reference location is known which allows the phase attribute at the field location to be determined. For example, if the reference location phase attribute is B and the instantaneous phase measured at both locations are the same, then the field location phase attribute is also B. If the instantaneous field location phase is leading or lagging the instantaneous reference location phase by 120 degrees, then the field location phase attribute is either A or C depending on the utilities known phase rotation.

To identify the field location phase attribute, the instantaneous phases at both locations have to be compared. Current phase identification instruments differ primarily in the method they each use to communicate the instantaneous phase reading between the reference location unit and the field location unit. Most manufacturers implement a real-time communication system using cell phones. Piesinger's, U.S. Pat. Nos. 6,667,610 and 7,031,859 describe a phase identification method that does not require real-time cell phone communication.

To phase identify high voltage transmission and distribution conductors, the phase identification instrument is typically attached to an insulated fiberglass stick. Short sticks are called hot sticks and long telescoping ones are called extendo sticks. The purpose of these sticks is to place the phase identification instrument in close proximity to the conductor being phase identified and to protect the lineman from the high voltage. To reach high overhead transmission and distribution lines, long extendo sticks on the order of 30 to 50 feet may be required.

Maneuvering the phase identification instrument, on the end of a long extendo stick, into position is difficult and time consuming. It is especially difficult in a strong wind because long extendo sticks are not very rigid. Gusting winds can cause the phase identification instrument to sway wildly making it nearly impossible to hold it into position next to a high overhead cable. However, even using short hot sticks is inconvenient because it takes time to attach the phase identification instrument to the stick and hot sticks have to be carefully stored and maintained to remain effective as an insulator.

Accordingly, it is the object of the present invention to provide a new and improved method and apparatus for phase identifying high voltage conductors without the need for hot sticks or extendo sticks.

SUMMARY OF THE INVENTION

Briefly, to achieve the desired objects of the present invention, a high sensitivity handheld phase identification instrument is combined with an optimum measurement procedure to allow a lineman to identify the phase attributes of high overhead transmission and distribution lines while standing on the ground near or underneath the overhead lines.

To achieve the required sensitivity, a high gain front end powerline voltage amplifier or hard limiter is used prior to the phase identification instrument processing circuit. Lineman measurement positions are selected, based on the type of overhead line construction, to ensure that at least one of the lines is closer to the lineman than the remaining lines.

It is a further object of the present invention to implement the front end amplifier so as to minimize the phase shift through the amplifier as a function of signal dynamic range. This allows the same handheld instrument to be used in ground level high voltage cabinets and in substations where close proximity to high voltage conductors result in high signal levels.

It is a further object of the present invention to implement a handheld phase identification instrument that can be used by lower-labor-cost non-linemen personnel by eliminating the need for close or direct phase identification instrument contact with the energized conductor.

These and other embodiments are discussed below.

BRIEF DESCRIPTION OF THE DRAWINGS

FIG. 26 illustrates a sketch of the handheld phase identification instrument.

DETAILED DESCRIPTION OF THE PREFERRED EMBODIMENTS

Commonly owned U.S. Pat. No. 6,667,610 issued Dec. 23, 2003 and U.S. Pat. No. 7,031,859 issued Apr. 18, 2006, which are incorporated herein by reference, describe a non-real-time phase identification system. Commonly owned patent application Ser. No. 12/927,767 filed Nov. 23, 2010, which is also incorporated herein by reference, describes a real-time phase identification system.

Figure 1:
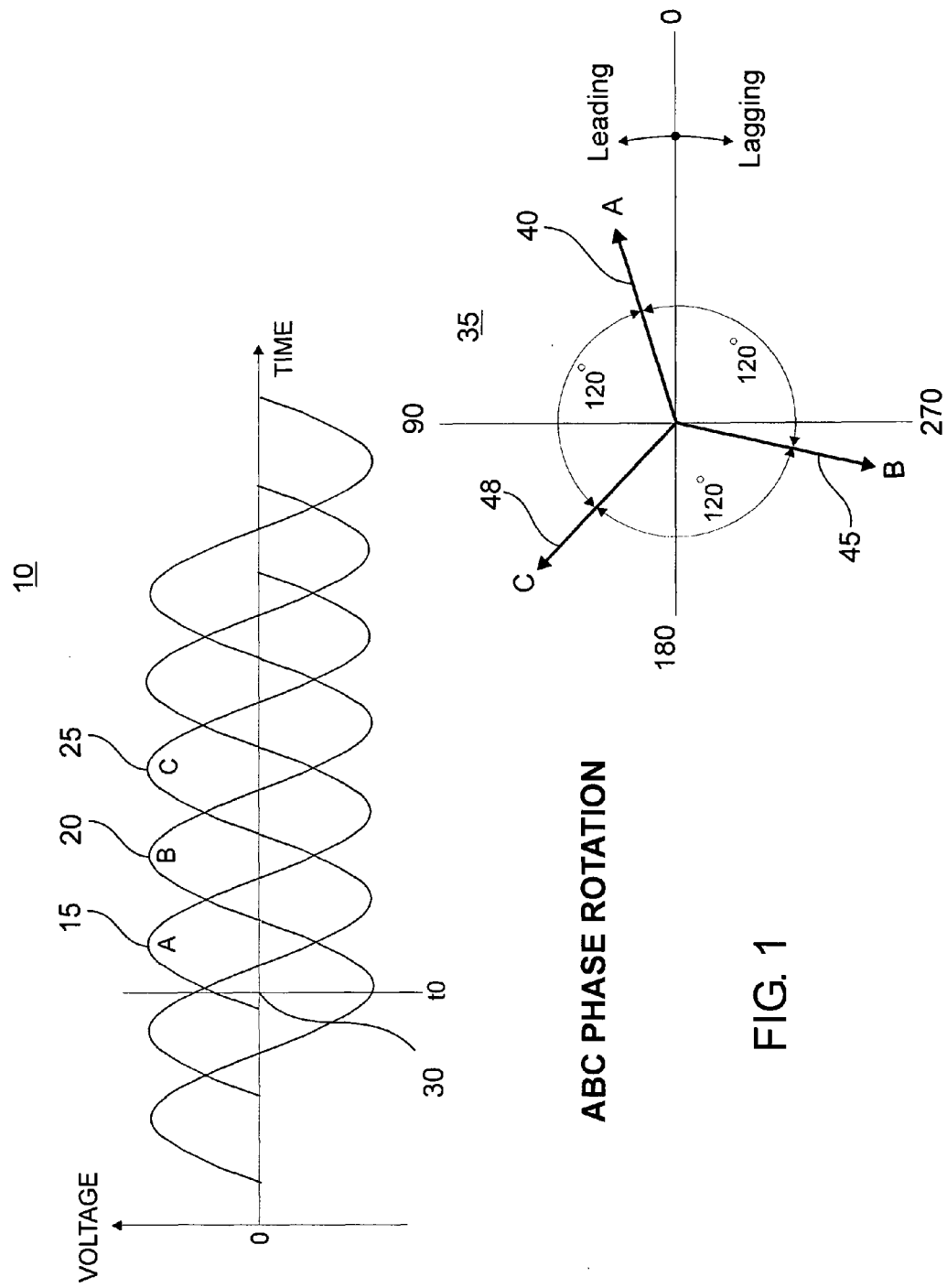
FIG. 1 illustrates voltage phase relationships in a three-phase power network with ABC phase rotation using both voltage-time and phase vector diagrams.

The basic concept of three-phase powerline voltage with ABC phase rotation is illustrated in FIG. 1. Voltage-time waveform 10 and rotational vector diagram 35 illustrate voltage-time waveform 10 at instantaneous time t0 30. Attribute B voltage 20 and vector 45 lags attribute A voltage 15 and vector 40 by 120 degrees. Likewise, attribute C voltage 25 and vector 48 lags attribute B voltage 20 and vector 45 by 120 degrees.

Figure 2:
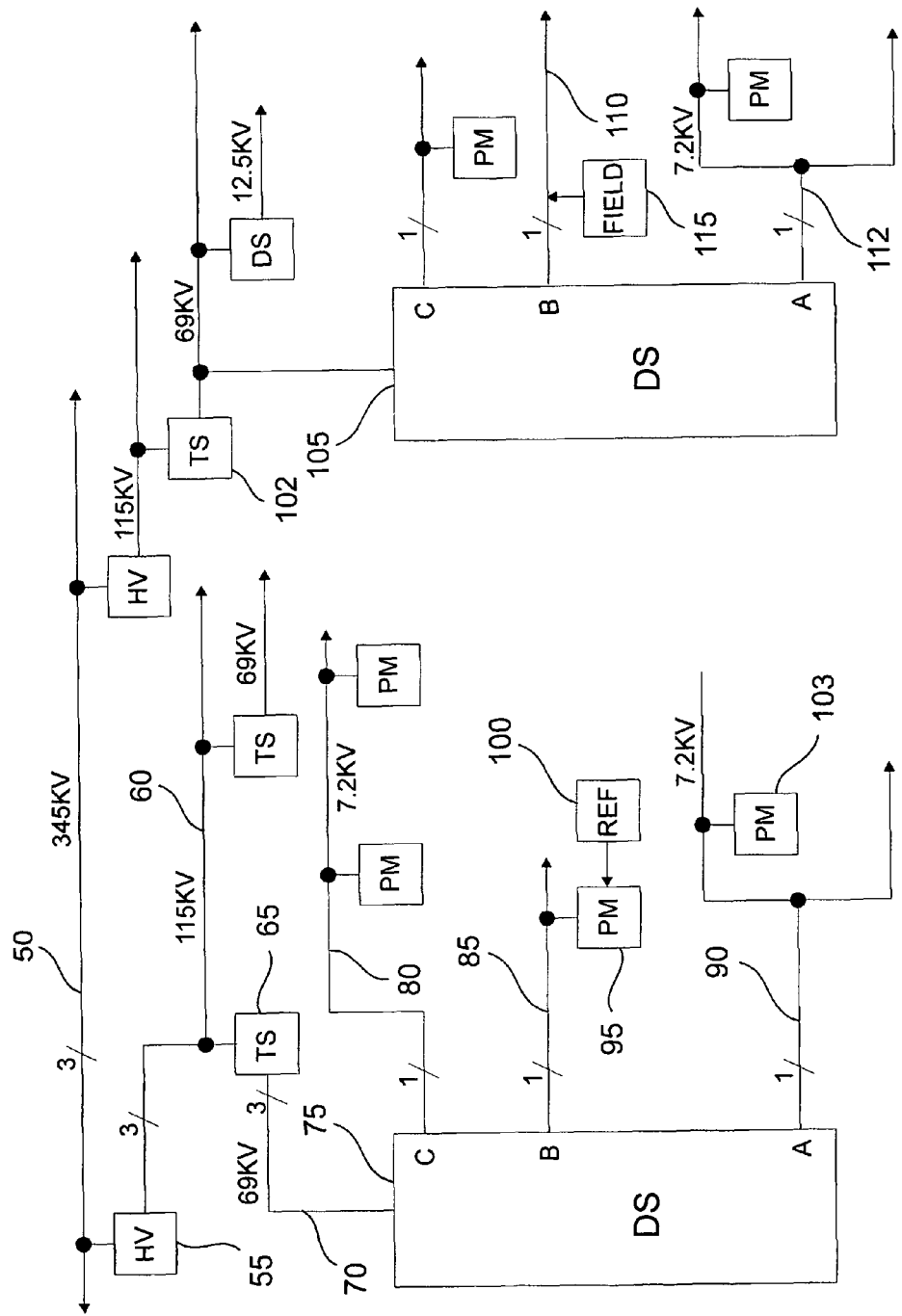
FIG. 2 illustrates a typical three-phase power distribution network.

A typical power distribution network is illustrated in FIG. 2 in which three-phase power cables 50 at 345 KV feed a series of high voltage (HV) transformers 55 spread out over a large geographical area. The 115 KV output 60 of transformers 55 are connected to a series of transmission transformers (TS) 65 also spread out over a large geographical area. The 69 KV output 70 of TS transformers 65 are connected to a series of distribution substation (DS) transformers 75 situated over a smaller geographical area.

The 7.2 KV phase-to-ground (12.5 KV phase-to-phase) phase A feeder 90 of DS transformer 75 powers a local distribution network, which contains a number of pole-mounted or pad-mounted (PM) transformers 103 that are used to provide the final 120/240 volt power to the commercial or residential customers. In the same manner, phase B feeder 85 and phase C feeder 80 also supply power to the same local distribution network.

At some base station reference location 100 in the power distribution network, a PM transformer 95 is used to provide a low-voltage reference phase that can be used to determine the unknown phase of a conductor at any field location 115 in the network.

As described in referenced U.S. Pat. Nos. 6,667,610 and 7,031,859, the instantaneous phase of voltage waveforms at two widely separated points in the power distribution network are measured and compared at the same instant of time using a GPS timing signal. Field location 115 phase measurement and GPS time are encoded into an alphanumeric sequence. At the base station reference location 100, this sequence is decoded and field location 115 phase measurement, taken by a field probe at the field location, is compared to reference location 100 phase measurement taken by a base station at the same instant of time.

For field location 115 illustrated in FIG. 2, both instantaneous phase measurements would be the same because both reference location 100 and field location 115 are on phase B. Therefore, conductor 110 would be identified as phase attribute B.

Figure 3:
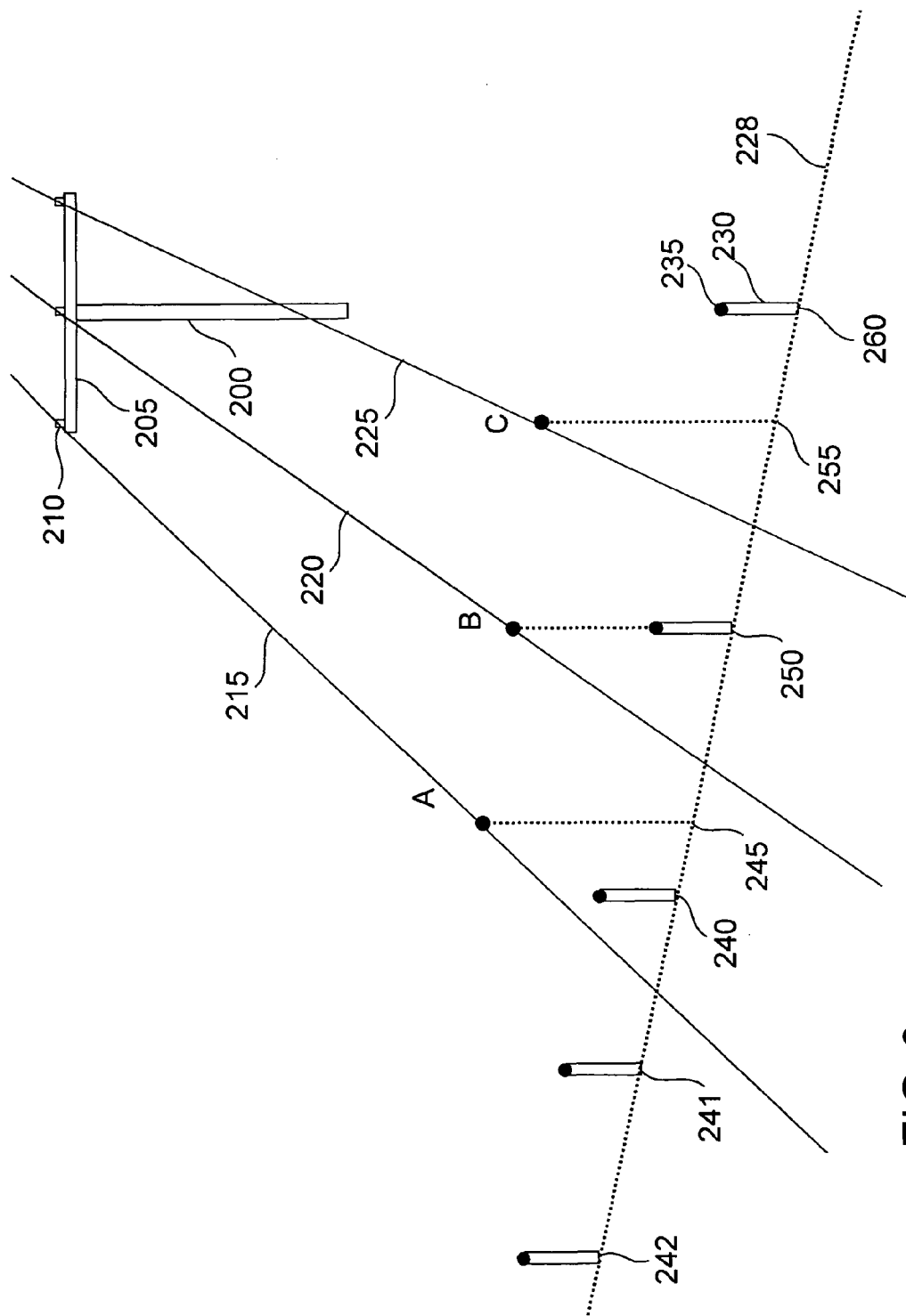
FIG. 3 illustrates typical horizontal three-phase construction and various phase attribute measurement positions near the lines.

In a typical distribution system, 12.5 KV phase-to-phase voltage is carried by three conductors (215, 220, and 225) strung between insulators 210 attached to crossarms 205 on wood poles 200 as illustrated in FIG. 3. In this illustration, phase attributes A, B, and C are carried on conductors 215, 220, and 225 respectively. Also illustrated is perpendicular path 228 along the ground under these conductors. Conductors 215, 220, and 225 are directly above ground points 245, 250, and 255 respectively. A lineman 230 holds phase identification instrument 235 and takes phase measurements at various locations 240, 250, and 260.

Figure 4:
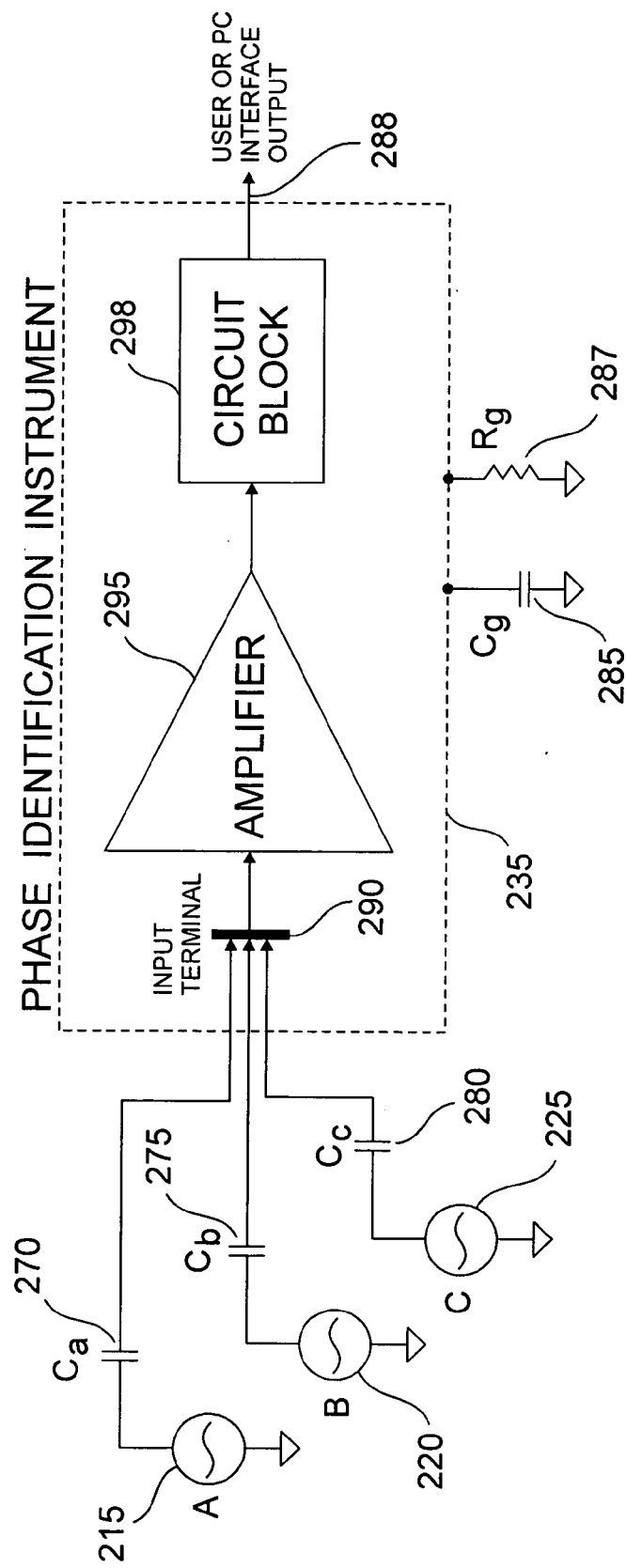
FIG. 4 illustrates a block diagram of the phase identification instrument.

FIG. 4 illustrates the capacitive coupling between the conductors and non-contact phase identification instrument 235. Phase identification instrument 235 functions as the field probe at field location 115 in FIG. 2. Capacitor 270 represents the coupling between phase A conductor 215 and input terminal 290 of phase identification instrument 235. Capacitor 275 represents the coupling between phase B conductor 220 and input terminal 290. Capacitor 280 represents the coupling between phase C conductor 225 and input terminal 290. The value of each of these capacitors vary as a function of distance between input terminal 290 and each conductor. The impedance of phase identification instrument 235 with respect to ground is represented by its resistance to ground 287 and its capacitance to ground 285.

The powerline voltage signal on input terminal 290 is amplified using amplifier 295 and processed using circuit block 298. Circuit block 298 is equivalent to typical industry phase identification meters and in particular to the phase identification meters described in aforementioned commonly owned U.S. Pat. Nos. 6,667,610 and 7,031,859 and patent application Ser. No. 12/927/767. Output 288 represents either phase identification instrument 235 internal display, wired output, or bluetooth communication output to a personal computer (PC).

The magnitude of the powerline voltage signal due to each conductor into amplifier 295 is primarily a function of the distance between conductors 215, 220, and 225 and input terminal 290 since the capacitance of capacitors 270, 275, and 280 decrease with distance. These powerline voltage signals sum together on input terminal 290 to form a resultant vector.

Figure 5:
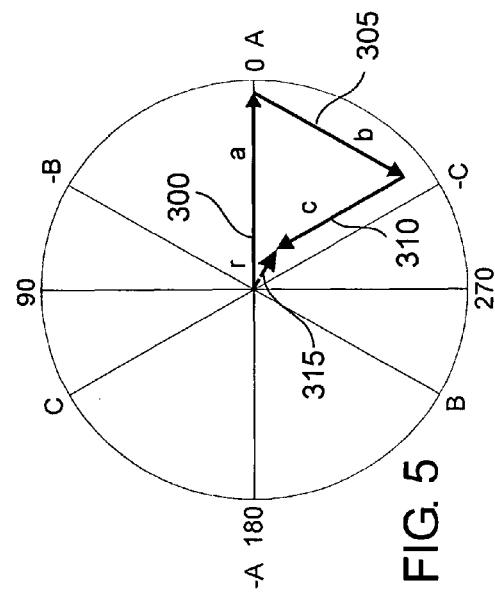
FIG. 5 illustrates the resultant vector due to near, center, far conductor attributes ABC.

FIG. 5 illustrates the expected powerline voltage signal phase vectors into amplifier 295 for a lineman standing at position 240 in FIG. 3. The strongest phase vector 300 is from phase A since phase identification instrument 235 is closest to phase A conductor 215. The second strongest phase vector 305 is from phase B since phase B conductor 220 is the next closest conductor. The weakest phase vector 310 is from phase C since phase C conductor 225 is the furthest conductor.

If all three conductors were equally distant from phase identification instrument 235, resultant vector 315 would be zero. That is, the sum of equal magnitude three-phase voltage vectors with 120 degree separation is zero. However, as illustrated in FIG. 5, the assumed unequal magnitude phase vectors 300, 305, and 310 sum to the non-zero resultant vector 315. Note that for small differences between the magnitudes of phase vectors 300, 305, and 310, the magnitude of resultant vector 315 is small and its phase shift with respect to the phase of the strongest phase vector 300 is between 0 and 60 degrees.

The capacitance between two objects falls off rapidly when the distance between them is small and falls off slowly as the distance between them becomes large. Since the average distance between phase identification instrument 235 and the conductors is large and the differential distance between phase identification instrument 235 at position 240 and each of the conductors is small, the differential difference between phase vectors 300, 305, and 310 is also small. Therefore, phase identification instrument 235 indicates phase attribute A for closest conductor 215 since the lagging resultant vector phase shift is less than 60 degrees.

On primary three-phase circuits, a phase error boundary between adjacent phase attributes is 60 degrees. That is, a phase error less than 60 degrees will not cause a phase attribute error. Thus, phase shifts below 60 degrees indicate the correct phase attribute for the closest conductor.

Figure 6:
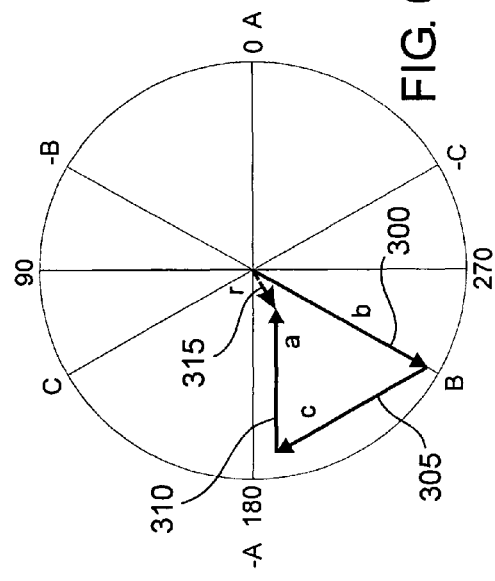
FIG. 6 illustrates the resultant vector due to near, center, far conductor attributes BCA.

FIG. 6 illustrates resultant vector 315 for the situation where the lineman was again standing at position 240 and conductor 215 was phase B, conductor 220 was phase C, and conductor 225 was phase A. This time the strongest phase vector 300 is phase B and thus phase identification instrument 235 will correctly indicate the phase attribute of closest conductor 215 as phase B.

Figure 7:
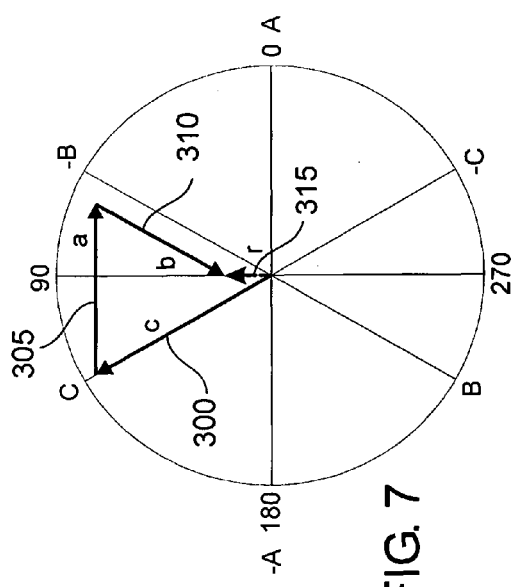
FIG. 7 illustrates the resultant vector due to near, center, far conductor attributes CAB.

FIG. 7 illustrates resultant vector 315 for the situation where the lineman was again standing at position 240 and conductor 215 was phase C, conductor 220 was phase A, and conductor 225 was phase B. This time the strongest phase vector 300 is phase C and phase identification instrument 235 will correctly indicate the phase attribute of closest conductor 215 as phase C.

Figure 8:
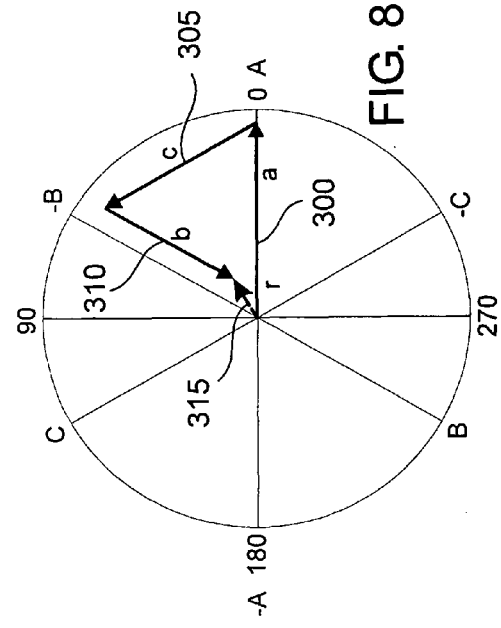
FIG. 8 illustrates the resultant vector due to near, center, far conductor attributes ACB.
Figure 9:
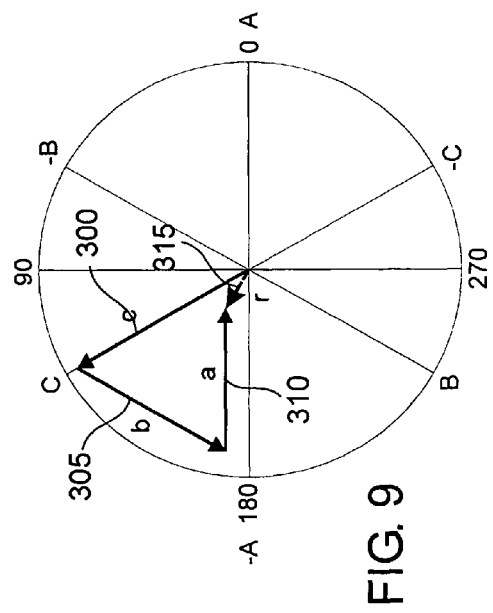
FIG. 9 illustrates the resultant vector due to near, center, far conductor attributes CBA.
Figure 10:
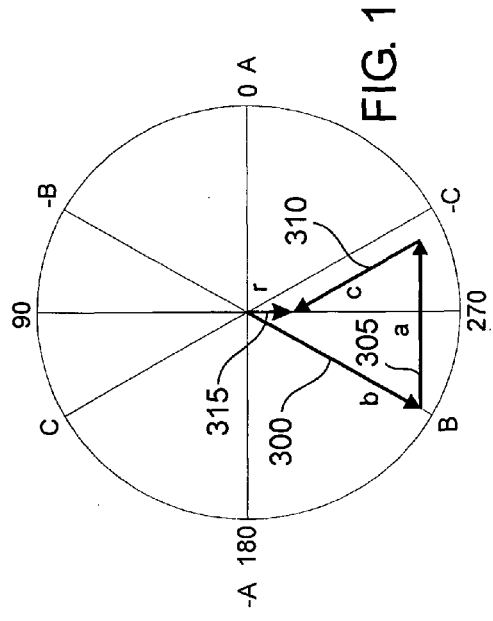
FIG. 10 illustrates the resultant vector due to near, center, far conductor attributes BAC.

FIG. 8, FIG. 9, and FIG. 10 indicate additional results for standing positions and conductor phases where phase vectors 300, 305, and 310 represent the near, center, far phase vectors respectively resulting from near, center, far distances between the indicated conductor phases and phase identification instrument 235.

Figure 11:
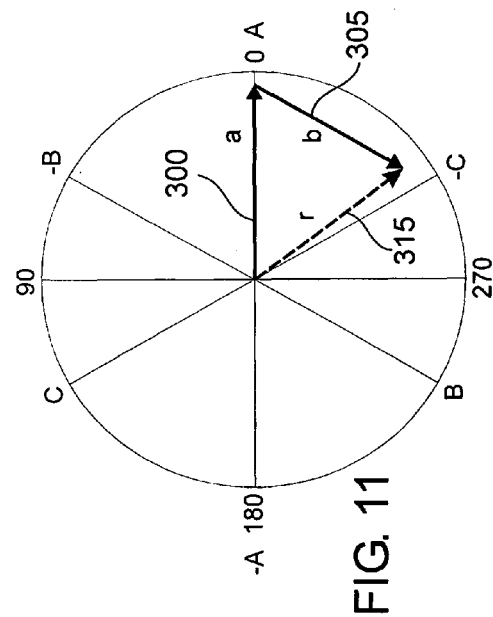
FIG. 11 illustrates the resultant vector due to near, far conductor attributes AB.

FIG. 11 illustrates the resultant vector if phase C conductor 225 is missing in FIG. 3 and the lineman is standing at position 240. In this case, the phase of resultant vector 315 is lagging phase vector 300 by less than 60 degrees. Phase identification instrument 235 would again correctly indicate the phase attribute of the closest conductor as phase A.

Figure 12:
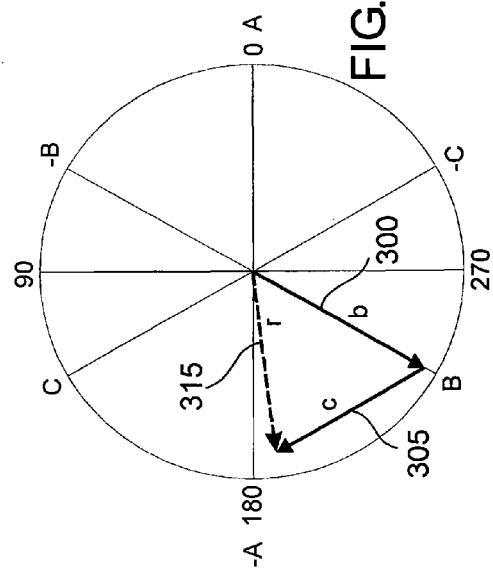
FIG. 12 illustrates the resultant vector due to near, far conductor attributes BC.
Figure 13:
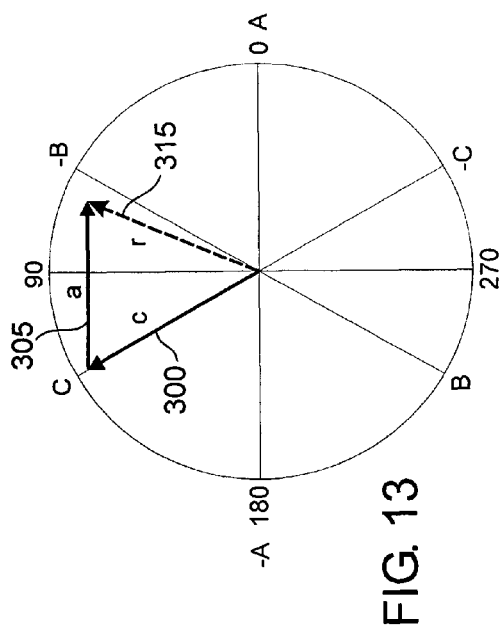
FIG. 13 illustrates the resultant vector due to near, far conductor attributes CA.

FIG. 12 and FIG. 13 illustrate two other conditions in which only 2 phase conductors are implemented. Again, phase identification instrument 235 would correctly indicate the phase attribute of the closest conductor.

Figure 14:
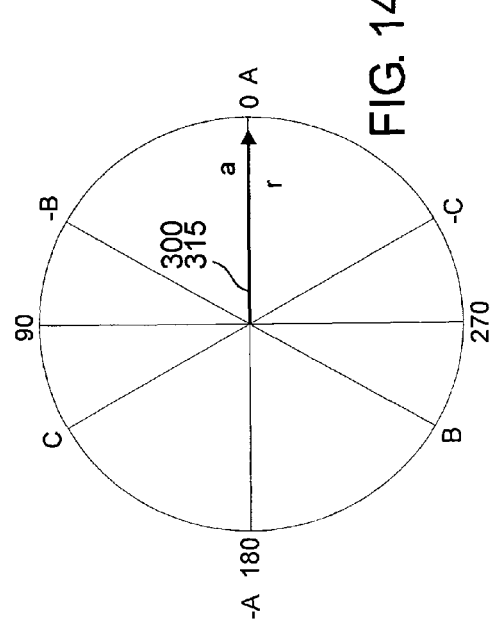
FIG. 14 illustrates the resultant vector due to single conductor attribute A.
Figure 16:
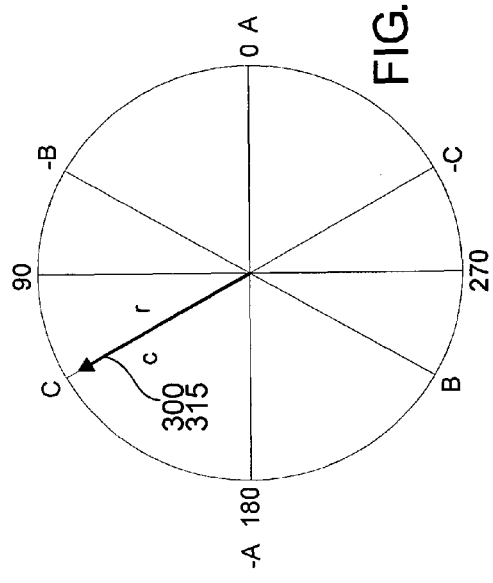
FIG. 16 illustrates the resultant vector due to single conductor attribute C.
Figure 15:
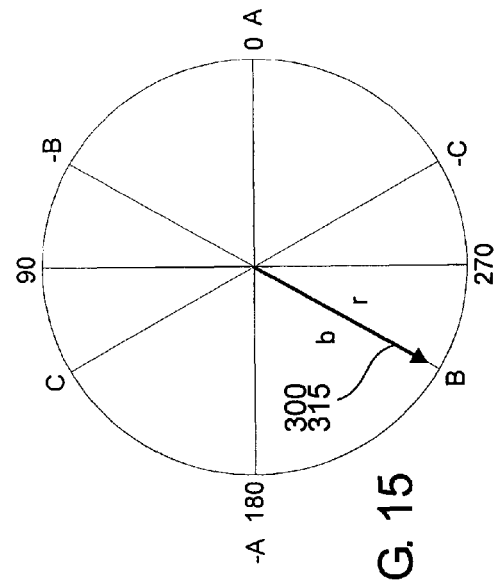
FIG. 15 illustrates the resultant vector due to single conductor attribute B.

FIG. 14, FIG. 15, and FIG. 16 illustrate the resultant vectors when only a single phase conductor is present. When only a single phase conductor is present, no phase shift occurs so phase identification instrument 235 correctly indicates the phase attribute of the single conductor.

Figure 17:
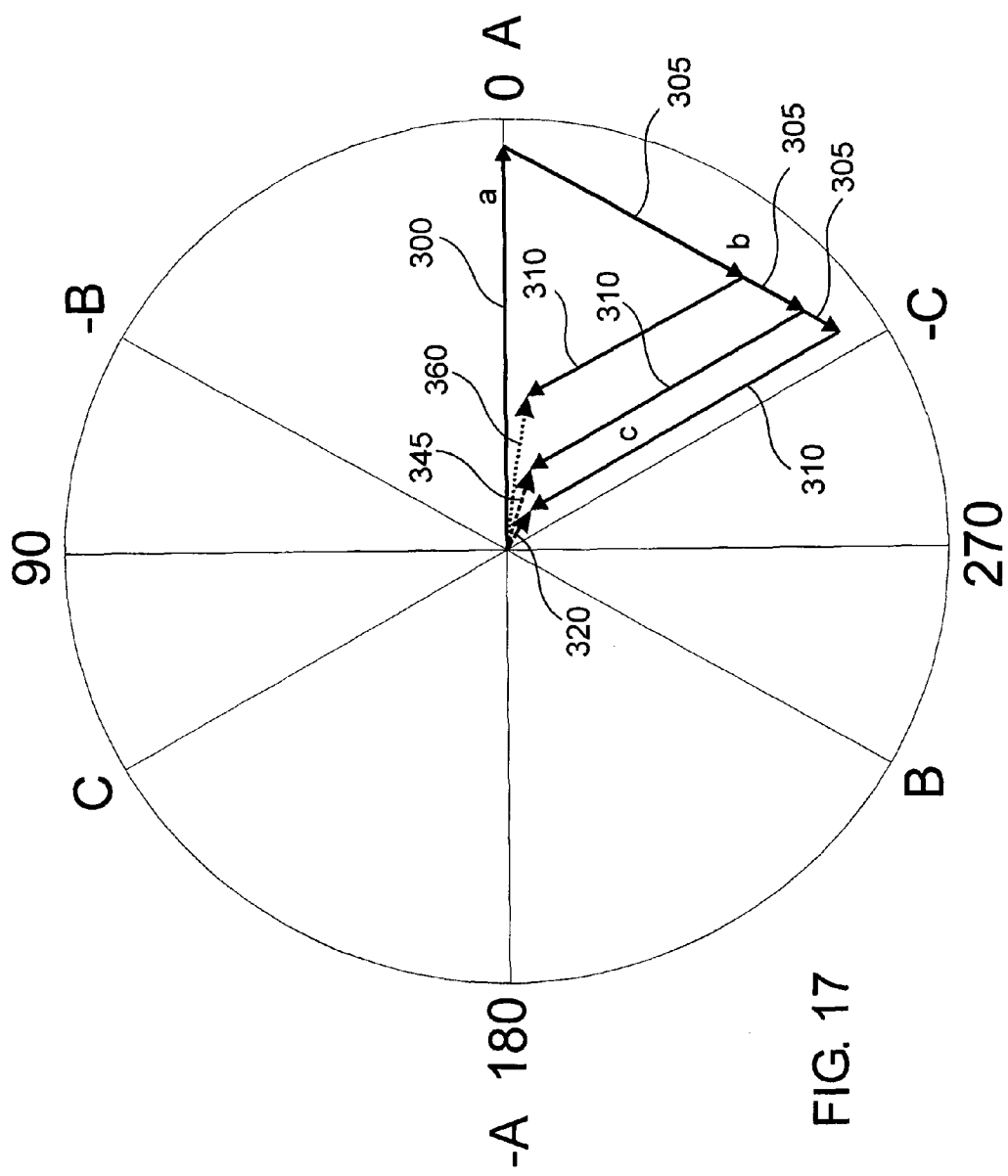
FIG. 17 illustrates the resultant vectors for different differential distances from three-phase conductors whose near, center, far attributes are ABC.
Figure 18:
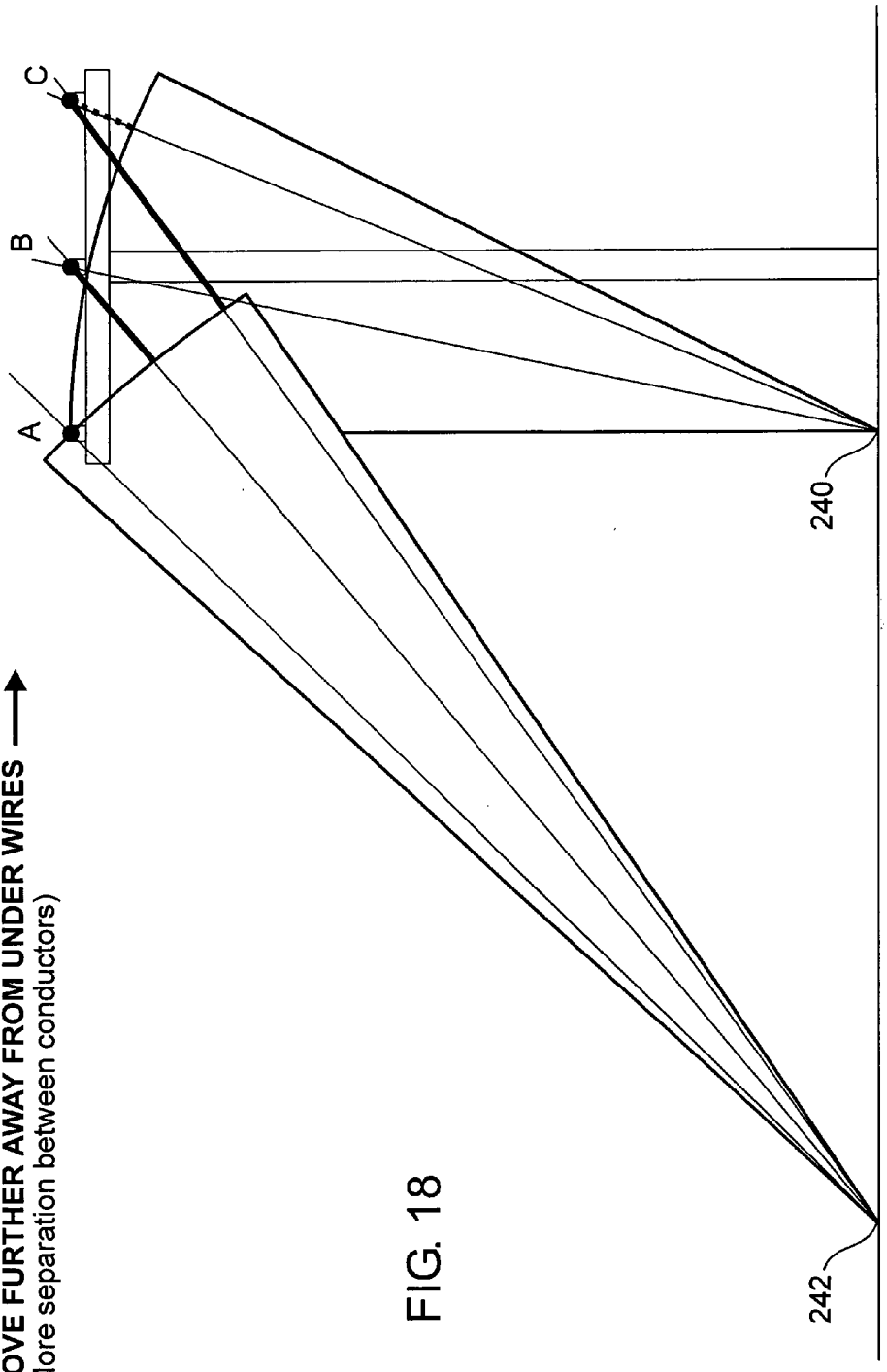
FIG. 18 illustrates conductor distances for different measurement positions on horizontal overhead lines.

FIG. 17 illustrates the resultant vectors when the lineman stands at positions 240, 241, and 242 in FIG. 3. FIG. 18 illustrates the near, center, far distances for positions 240 and 242. For each position, the magnitude of closest phase vector 300 is normalized to the same magnitude for comparative purposes. Resultant vectors 320, 345, and 360 represents the lineman standing at positions 240, 241, and 242 respectively.

As illustrated in FIG. 18, the near, center, far distances at position 240 are more equal than at position 242. Therefore, resultant vector 320 approaches 60 degrees lagging. At position 242, the near, center, far differential distances are greater so resultant vector 360 approaches 0 degrees lagging.

This resultant vector lagging phase shift reduction with increasing distance from horizontal three-phase lines only takes place at relative close ranges. At very large distances from the conductors, the differential distances from each line to phase identification instrument 235 are nearly equal so capacitance values 270, 275, and 280 are nearly equal. Therefore, when phase identification instrument 235 is at very large distances from horizontal lines, the resultant vector phase shift again approaches 60 degrees.

Figure 19:
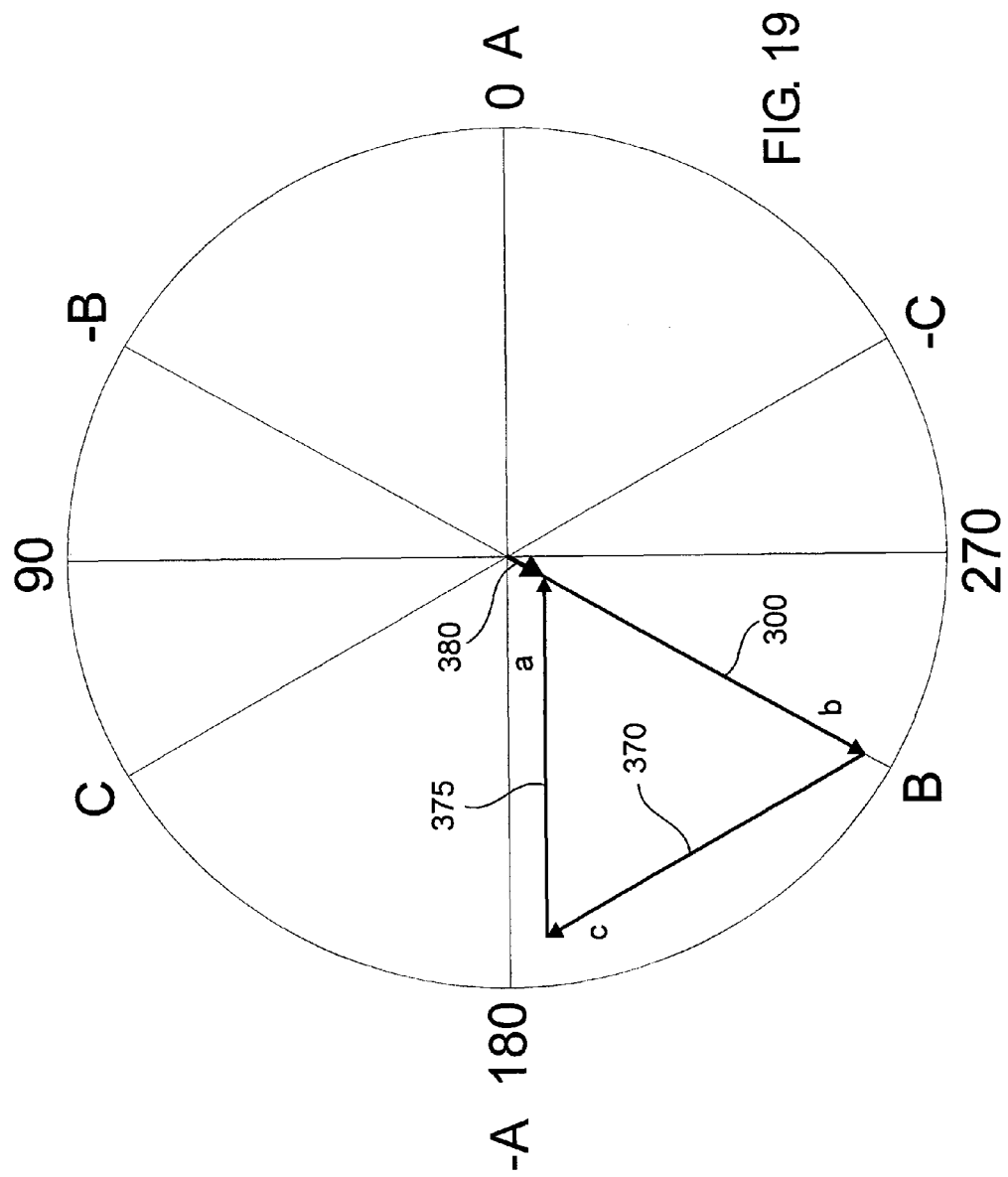
FIG. 19 illustrates the resultant vector when standing directly under the center conductor of horizontal overhead lines with attributes ABC.

FIG. 19 illustrates the resultant vector when the lineman stands directly under phase B conductor 220 at position 250 in FIG. 3. Assuming conductors 215 and 225 are equally spaced from conductor 220, phase vectors 370 and 375 will be equal length. Note that when standing under the center conductor, the resultant vector 380 is in phase with the center conductor phase vector 300.

Figure 20:
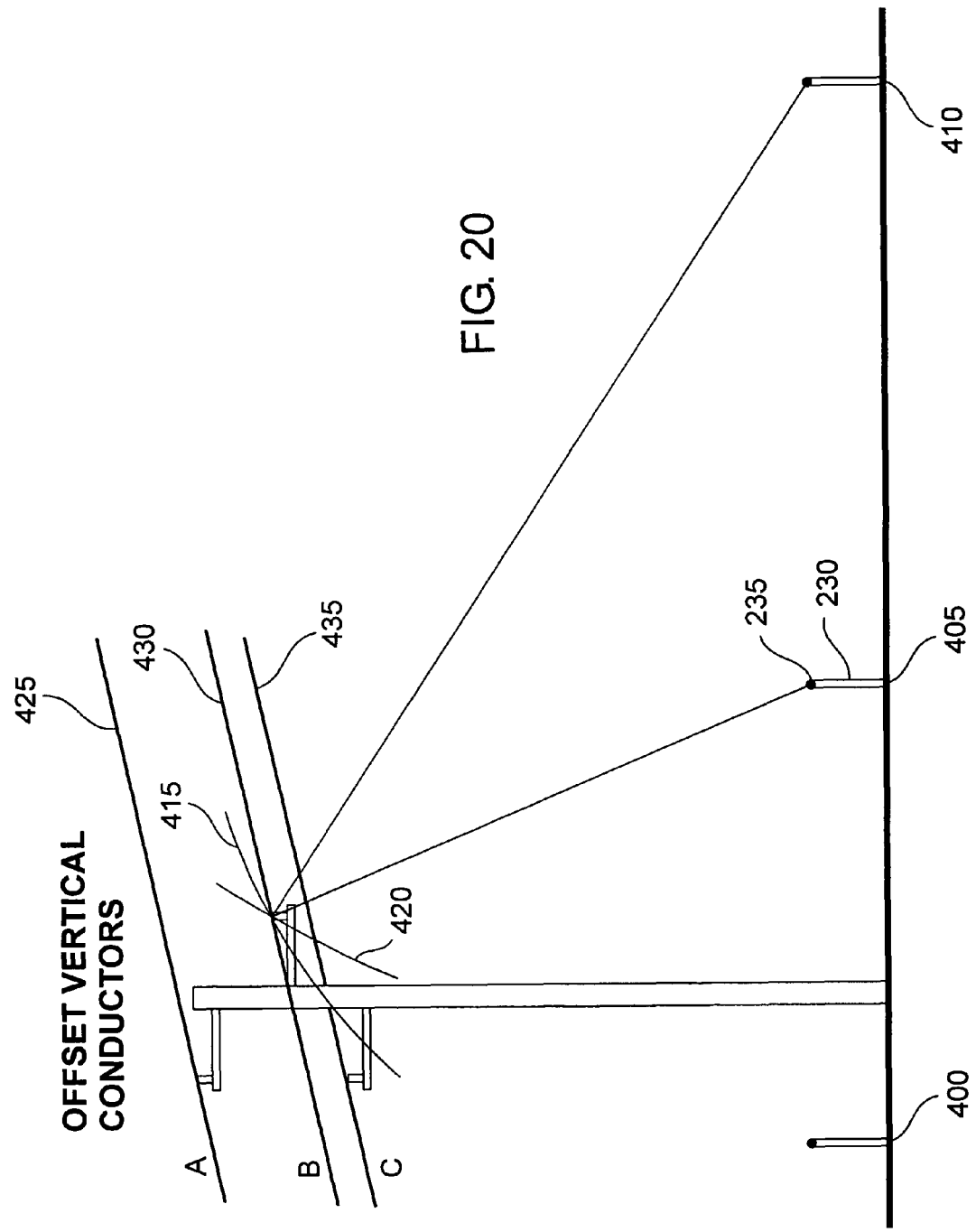
FIG. 20 illustrates offset vertical overhead line construction.

FIG. 20 illustrates offset vertical overhead line construction in which two phases are attached on one side of the pole and the third phase is attached between them on the opposite side of the pole. With the lineman standing at position 400, the phase attribute of bottom conductor 435 can easily be determined since it is the closest conductor. With the lineman standing at position 405 on the center conductor side of the pole, both conductors 430 and 435 are at nearly the same distance as indicated by constant distance arc 415. However, if the lineman moves further away on the center conductor side of the pole, the phase attribute of center conductor 430 can easily be determined since it is clearly the closest conductor as indicated by constant distance arc 420. The phase attribute of top conductor 425 is the attribute not indicated for bottom conductor 435 or center conductor 430. That is, the A, B, or C attribute not measured which in this example is attribute A.

Figure 21:
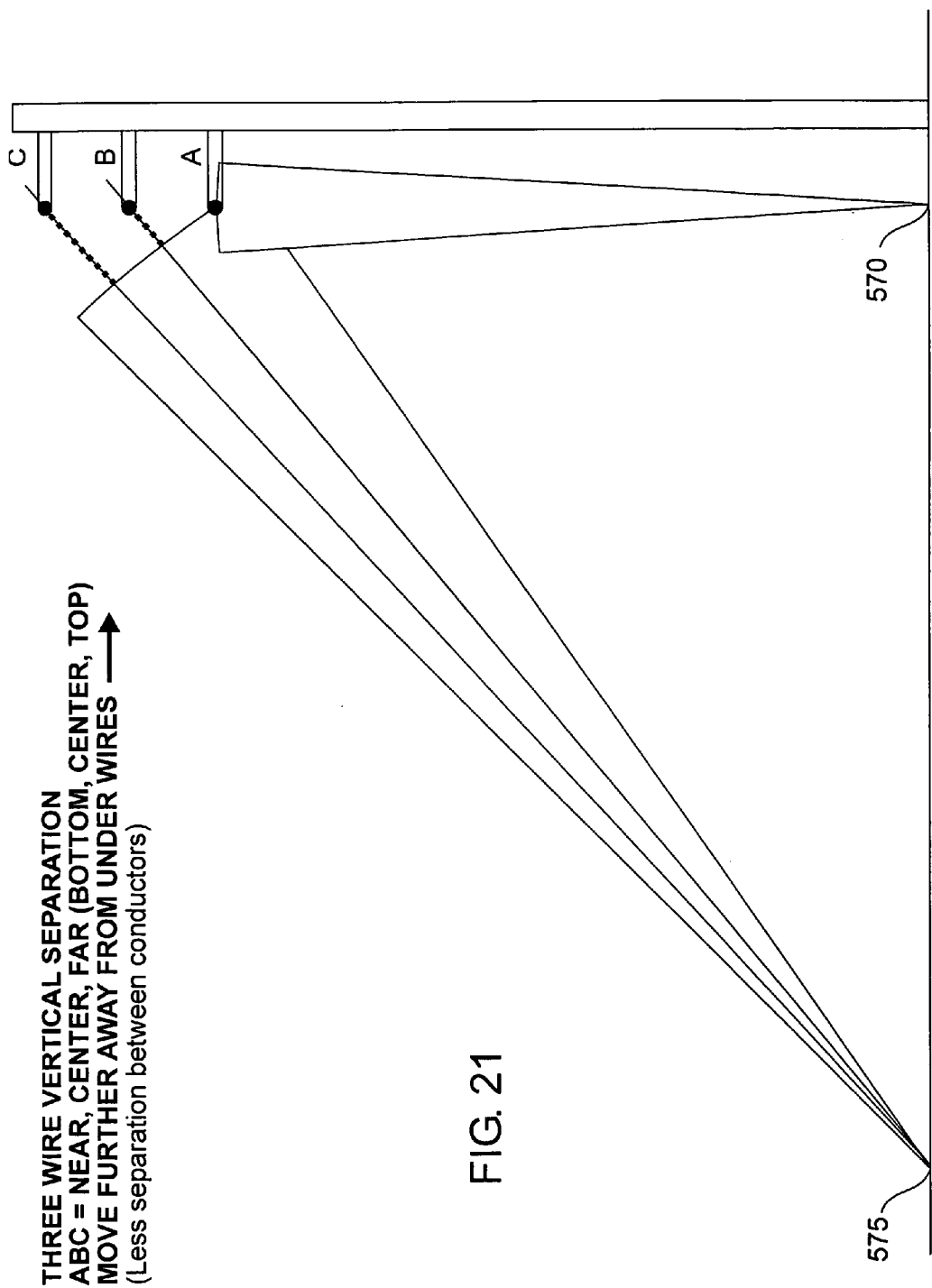
FIG. 21 illustrates conductor distances for different measurement positions on vertical overhead lines.

Another common construction is a vertical arrangement of the conductors as illustrated in FIG. 21 where all three conductors are on the same side of the pole. In this construction, only the bottom conductor can be the closest conductor at any lineman position along ground level. The phase attributes of the middle and top conductors must be determined using the resultant vector phases illustrated in FIGS. 5 through 10 and the rotation of the resultant vector phase at different lineman positions as was illustrated in FIG. 17.

FIG. 21 illustrates the near, center, far distances when the lineman stands at position 570 directly under three-phase vertical lines and when standing at position 575 left of the vertical lines. The greatest differential distance between the conductors occurs when standing directly under the vertical lines thus giving the resultant vector 360 in FIG. 17. As the lineman moves to the left, resultants 345 and 320 are obtained respectively as the lineman moves further left. Therefore, the resultant vector phase shift approaches 0 degrees lagging when standing under the vertical lines and approaches 60 degrees lagging as the lineman moves away from the vertical lines.

Figure 22:
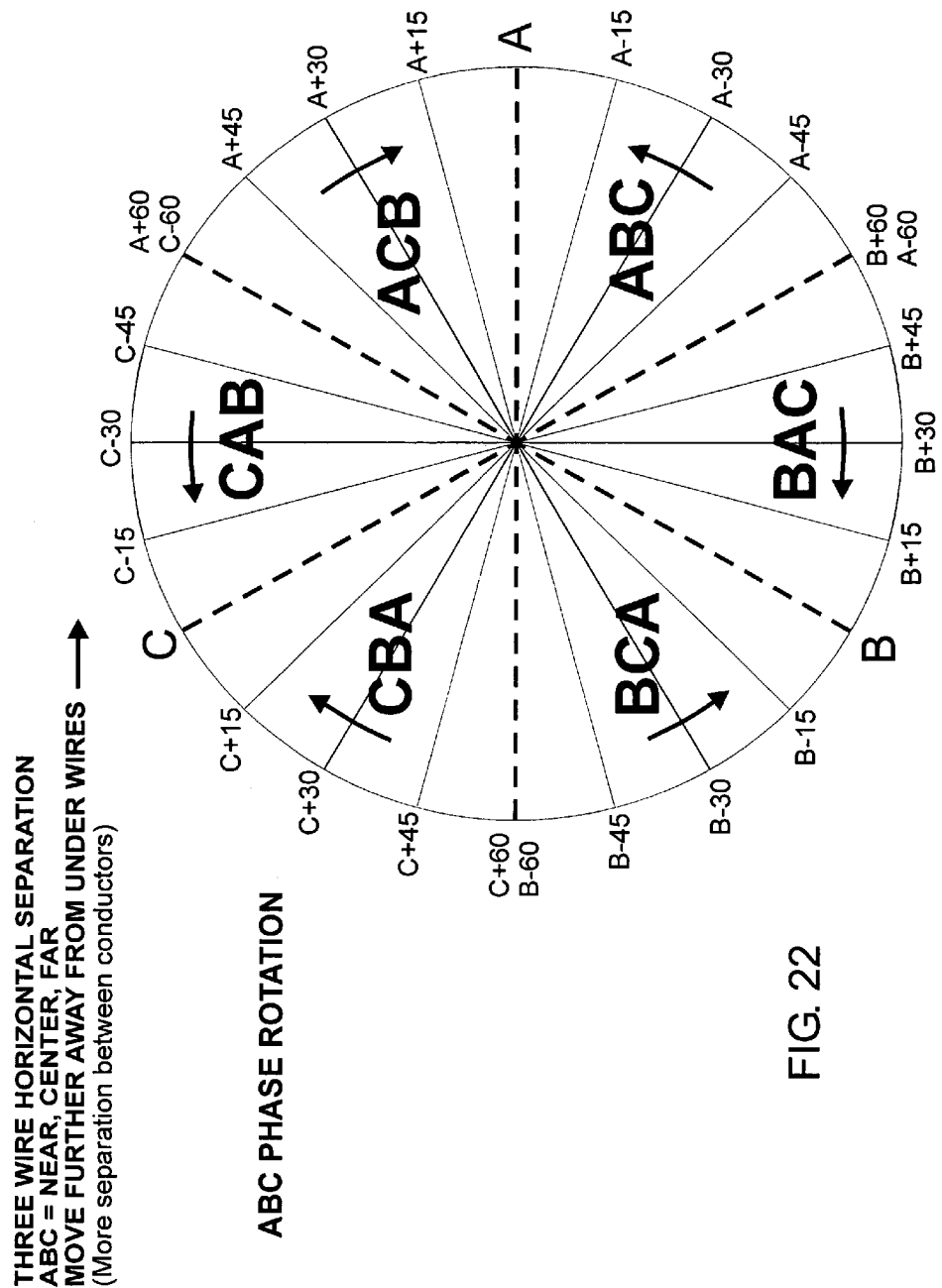
FIG. 22 illustrates the expected resultant vector phase angle and its rotation with distance for phase attribute measurements on horizontal overhead lines with ABC phase rotation.
Figure 23:
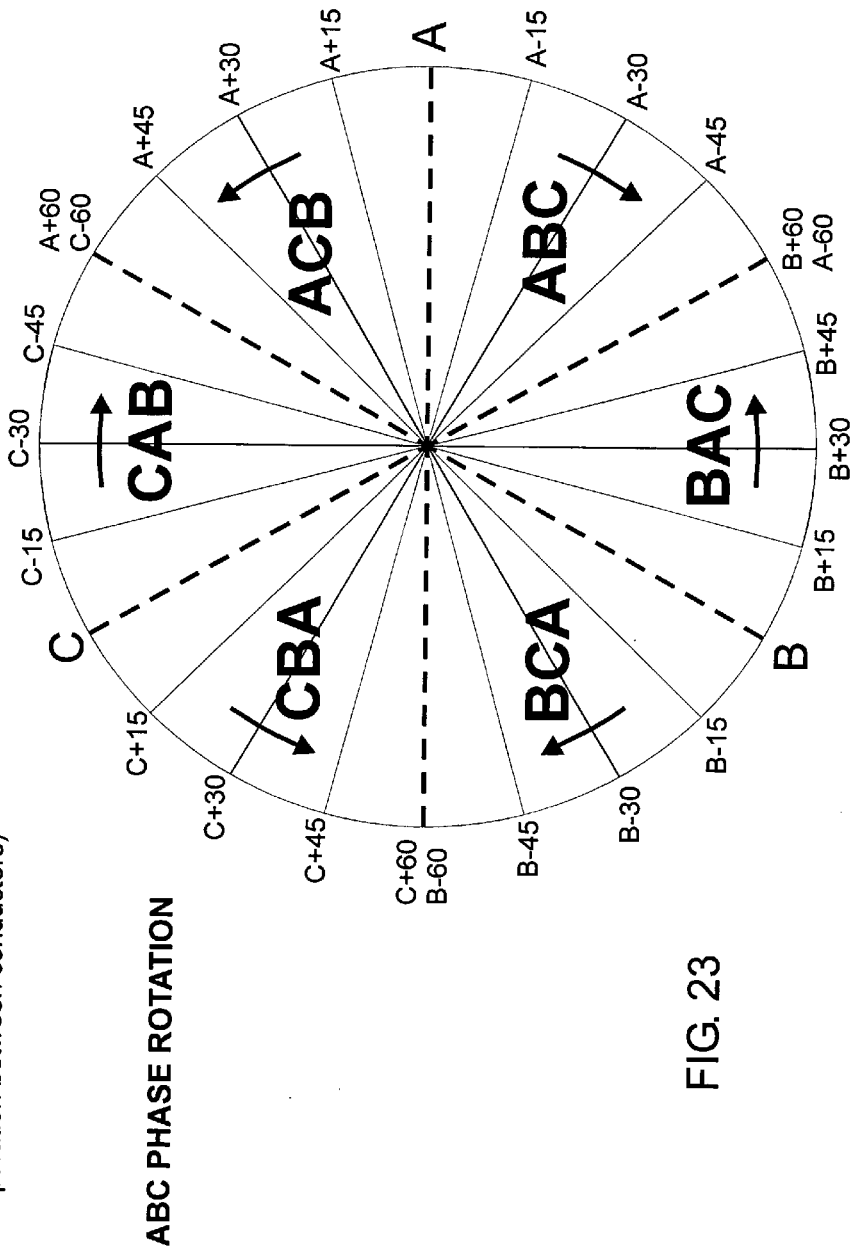
FIG. 23 illustrates the expected resultant vector phase angle and its rotation with distance for phase attribute measurements on vertical overhead lines with ABC phase rotation.

The phase shift of the resultant vector as the lineman moves away from horizontal and vertical three-phase lines with ABC phase rotation can be summarized in FIG. 22 and FIG. 23 respectively. If the near, center, far horizontal conductors are ABC, FIG. 22 indicates that the resultant phase shift will be lagging and the lagging phase shift will decrease as the lineman moves further from the horizontal lines. If these same lines were vertical, FIG. 23 indicates that the resultant phase shift will be lagging and the lagging phase shift will increase as the lineman moves further from the vertical lines.

FIG. 22 and FIG. 23 illustrate how the near, center, far conductor phase attributes of three-phase lines in horizontal or vertical construction can be determined from the phase shift of the resultant vector. The resultant vector phase for each of the 6 possible different near, center, far conductor phase attributes will fall in one of the 6 illustrated 60 degree phase segments. The middle 30 degrees of each 60 degree segment indicate the most probable phase shift for nominal distances from the three-phase lines.

For example, if phase identification instrument 235 indicated B phase with a −30 degree phase shift, the lineman would know that the phase attributes of the near, center, far conductors is BCA. If the lines were horizontal, the lineman would expect the phase shift reported by phase identification instrument 235 to increase towards −45 degrees as the lineman moved closer to the lines and decrease towards −15 degrees as the lineman moved further from the lines. If the lines were vertical, the phase shift with movement would be in the opposite direction.

In a typical utility, the voltage magnitude of three-phase conductors are not always precisely equal and their phases are not always precisely separated by 120 degrees. The horizontal or vertical separation between three-phase conductors are also not always equal. Additionally, static phase offsets between the reference base station phase and the utility phase is not always adjusted precisely to zero degrees in phase identification instrument 235. All these effects can cause small resultant vector phase shifts that can place the resultant phase in an adjacent 60 degree segment of FIG. 22 and FIG. 23 thus causing a phase attribute error. Two techniques can be used to minimize making these attribute errors.

Suppose the lineman was standing at position 240 in FIG. 3 and obtained near, center, far conductor phase attributes ABC from FIG. 22. By moving to position 260, the lineman would expect to obtain near, center, far attributes CBA. This second measurement at position 260 confirms that the first measurement at position 240 was correct. If instead, the second measurement at position 260 was BCA, the two measurements don't match.

The near conductor signal is strongest and most dominate and its phase attribute is indicated by the first letter of phase identification instrument 235 reported phase attribute. Therefore, the ABC attribute measured at position 240 indicates near conductor 215 in FIG. 3 is attribute A. The BCA attribute measured at position 260 indicates near conductor 225 is attribute B. Center conductor 220 must therefore be attribute C which indicates the BCA attribute measured at position 260 is the correct one.

If these same results are obtained for vertical lines, it is not possible to stand on the other side (stand above) the vertical lines. Instead, a measurement directly under the vertical lines can be compared with a measurement away from the vertical lines.

Suppose the lineman was standing at position 570 in FIG. 21 and obtained near, center, far conductor phase attributes ABC at −10 degrees lagging from FIG. 23. By moving to position 575, the lineman would expect to obtain the same near, center, far attributes at a more negative lagging angle. Obtaining a more negative lagging angle at position 575 confirms that the first measurement at position 570 was correct. If instead, the second measurement at position 575 was a less negative lagging angle or perhaps phase attribute ACB with a small leading angle, the two measurements don't match.

Since the near conductor signal is strongest and most dominate, the near (bottom) vertical conductor is phase A. Since the resultant vector phase shift was in the counterclockwise direction with movement away from the vertical conductors, the correct near, center, far attributes should be ACB. That is, the center and far (top) vertical conductors should be C and B respectively.

Phase identification instrument 235 can be designed to report all three phase attributes for each measurement or to report only the phase attribute of the nearest conductor. If only two of the three-phase conductors are present, the reported far attribute can simply be ignored. For example, if ABC was reported for two conductor construction, the near conductor attribute would be A and the far conductor attribute would be B. The third attribute C would be ignored.

Phase attribute errors can be minimized by accurately calibrating phase identification instrument 235 to the substation tagging reference phase. The best method of performing this calibration is to obtain a phase attribute measurement on an isolated single phase conductor. Examples are single phase conductors that branch off of three-phase overhead lines or an unshielded single phase conductor in a three-phase switching cabinet. The latter can be obtained by removing a shielding cap from one of the conductor bushings in the cabinet.

As illustrated in FIG. 14, FIG. 15, and FIG. 16, there is no resultant vector phase shift when measuring single phase conductors. Phase identification instrument 235 can be precisely calibrated by measuring the phase attribute of an isolated single phase conductor with known phase attribute and adjusting the resultant vector phase to match the reference phase for that phase attribute. This adjustment is typically performed in the phase attribute computing software.

Many phase attribute measurements are taken in substations, cabinets, ground level transformers, and from bucket trucks. In these situations, the safe handheld instrument separation distance is on the order of a few feet at most distribution voltages. This allows phase identification instrument 235 to be held close enough to the conductor under test to minimize the influence of other nearby conductors on the phase attribute measurement. In those situations, the phase attribute is determined using the resultant vector phase illustrated in FIGS. 14 through 16. Since phase identification instrument 235 does not have to be held within a few inches of the conductor, or actually touching the conductor, no hot stick is required.

The handheld phase identification instrument 235 described in this invention can be safely used by non-linemen to obtain phase attribute measurements on overhead lines, building power meters, and 120 volt wall sockets. This allows lower cost personnel to be used to gather phase attributes. By holding the handheld instrument close to residential meters, the primary phase attribute of the circuit or three-phase conductor feeding power to the residence can be determined. This allows low cost meter reader personnel to quickly gather phase attributes of buildings as they make their meter reading rounds.

Since the signal level into phase identification instrument 235 will vary from very low levels when at a large distance from overhead conductors to very large levels when used on ground level conductors, amplifier 295 must have a very high dynamic range. Also, its phase shift with input signal level must be as constant as possible to minimize any static phase shift variation with signal level which could led to phase attribute errors or mask the resultant vector phase variation with lineman position.

The most appropriate choice for amplifier 295 is to implement it as a hard limiter. A hard limiter essentially operates as a one bit analog to digital converter where any voltage above threshold has a "one" value and any voltage below threshold has a "zero" value. A hard limiter can be easily implemented using the open loop gain of an operational amplifier with no feedback resistor. A high gain, high speed (with respect to the 60 Hz powerline voltage frequency), high impedance, and low noise operational amplifier has exceptional sensitivity and dynamic range with very low phase shift variation. Its use in the present invention is key to implementing a high performance low cost solution for amplifier 295.

A hard limiter, followed by a bandpass filter, has the desirable characteristic of suppressing the relative signal level, of all low level signals, by 6 dB at the output of the hard limiter with respect to the strongest input signal. This characteristic helps eliminate all out-of-band interference signals since the strongest narrowband input signal will be the fundamental powerline frequency signal of 60 Hz in the USA and 50 Hz in many foreign countries. Bandpass filters in phase identification instrument 235 filters out non-powerline frequencies.

FIG. 26 illustrates a handheld version of phase identification instrument 235. Input terminal 290 consists of a thin metal disk which is connected to amplifier 295 inside plastic tube 289. Insulated cover 296 protects input terminal 290. Amplifier 295 is connected to circuit block 298. Movable grounded metal sleeve 297 is optional and can be used to make phase identification instrument 235 more directional.

For example, suppose the lineman stands at position 250 directly under center conductor 220 in FIG. 3 and points the handheld phase identification instrument 235 directly at conductor 220. Then irrespective of the distance differences between input terminal 290 and conductors 215, 220, and 225, the capacitance coupling between input terminal 290 and conductor 220 is greater than the coupling to conductors 215 and 225 because input terminal 290 faces conductor 220. Due to the thin disk profile of input terminal 290, the other two conductors have a more edge-on view and thus lower coupling capacitance. This lower capacitance provides some conductor signal directivity to phase identification instrument 235.

Optionally, this directivity can be increased by moving (299) grounded metal shield 297 over input terminal 290. This action further reduces the coupling to conductors 215 and 225. This movable shield feature can be beneficial in crowded cabinets, to reduce the interfering influence of adjacent conductors, when measuring the phase attribute of a particular conductor.

In most cases, precise lineman phase attribute measurement position is not required. All that is required is to follow the general position guidelines and use the resultant vector phase principals disclosed in this patent application. However, charts and diagrams can be prepared and supplied with phase identification instrument 235 to assist linemen in correctly gathering phase attributes. This is possible because the electric utility industry uses fairly standardized overhead, substation, and cabinet construction techniques throughout the industry. For each typical measurement situation, a diagram of optimum lineman position and the expected resultant vector results for each conductor phase situation can be produced and supplied to the lineman. This information could also take the form of programs or pictures on a personal computer.

Ideally, the magnitudes of each three-phase voltage vectors are identical and their phases are separated by exactly 120 degrees. In general, offsets from these ideal values are small in most situations. However, distribution circuits and loads can cause deviations which will slightly modify the resultant phase vectors illustrated in this disclosure. These variations change quite slowly in most situations since powerline circuitry seldom changes and loads vary slowly over the course of a day or days. To account for these variations, a lineman could first measure phase at a convenient accurate location (such as an isolated overhead single phase conductor or an unshielded conductor in a ground level cabinet) to determine the static phase and voltage magnitude variations involved. This information could then be entered into phase identification instrument 235 or a personal computer and used to compensate or modify the resultant vectors expected in each measurement situation.

Figure 24:
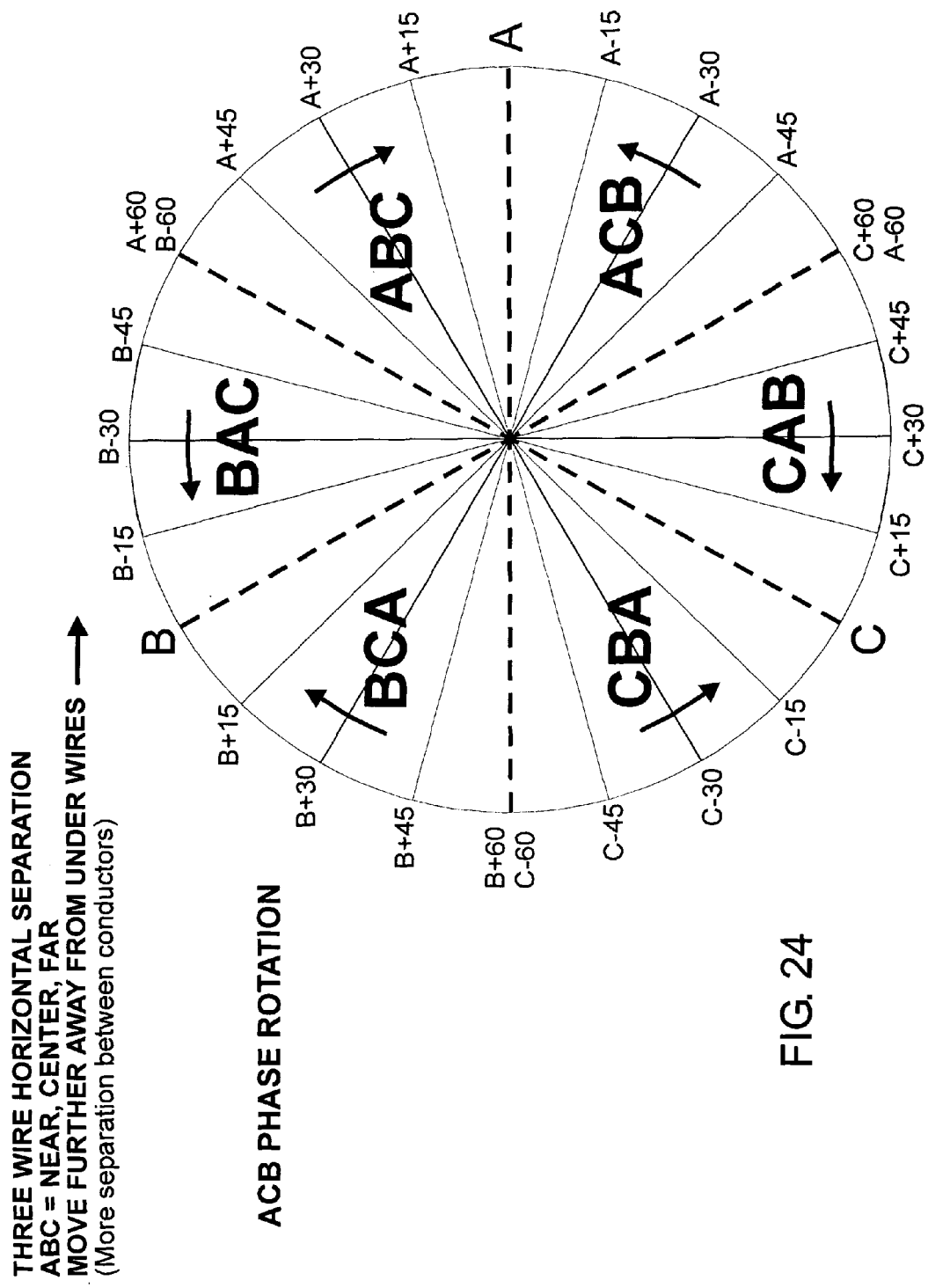
FIG. 24 illustrates the expected resultant vector phase angle and its rotation with distance for phase attribute measurements on horizontal overhead lines with ACB phase rotation.
Figure 25:
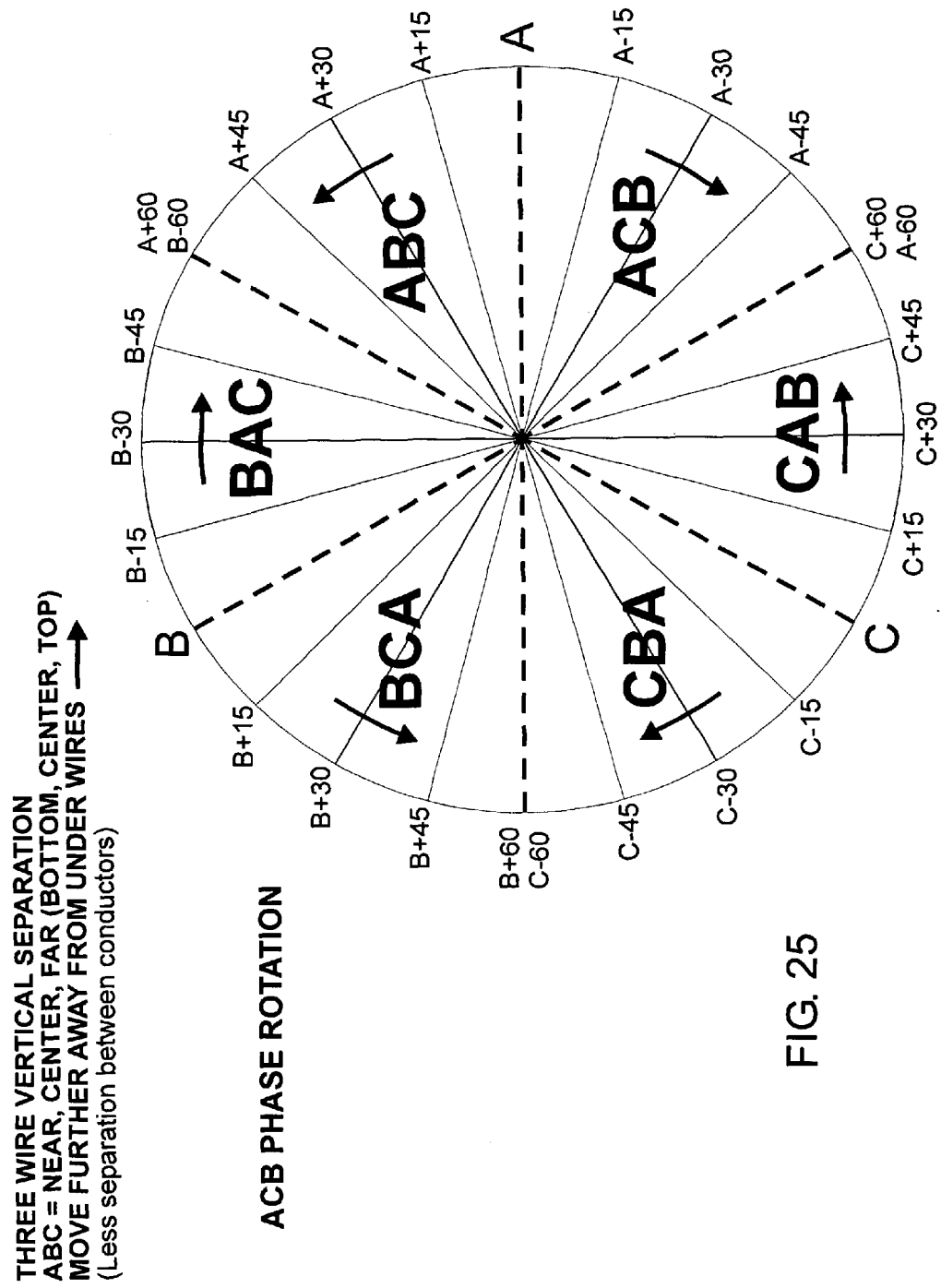
FIG. 25 illustrates the expected resultant vector phase angle and its rotation with distance for phase attribute measurements on vertical overhead lines with ACB phase rotation.

The vectors and phase attribute in all figures except FIG. 24 and FIG. 25 are for ABC phase rotation. In some utilities, phase rotation is ACB. For those utilities, B and C need to be reversed in all the figures. That is, wherever B appears, change it to C. Wherever C appears, change it to B. The phase shift of the resultant vector as the lineman moves away from horizontal and vertical three-phase lines with ACB phase rotation are summarized in FIG. 24 and FIG. 25 respectively.

Note that FIG. 22 and FIG. 23 illustrate for ABC phase rotation that ABC conductor attributes result in a lagging resultant vector phase while ACB conductor attributes result in a leading resultant vector phase. FIG. 24 and FIG. 25 illustrate for ACB phase rotation that ABC with a lagging phase becomes ACB with a lagging phase and ACB with a leading phase becomes ABC with a leading phase. The phase rotation with distance remains the same.

This characteristic can be used to determine the phase rotation of a utility if it is not already known. If the near, center, far attributes of three-phase equally spaced horizontal lines are known to be ABC and a lagging resultant vector phase (−30 degrees for example) is obtained, then the phase rotation is ABC. If a leading resultant vector phase (+30 degrees for example) is obtained, then the phase rotation is ACB. Typically, however, most utilities already know their phase rotation.

Phase attribute measurements are always taken by measuring conductor voltage with respect to ground. Currently, when phase attribute measurements are taken by mounting phase identification instrument 235 on an extendo stick and holding it close to an overhead conductor, the instrument reference to ground is through its capacitance to ground. However, since phase identification instrument 235 is high above the ground and in close proximity to other conductors, it capacitively couples to both ground and other conductor phases. This coupling, along with the resistance of the hot stick to ground forms a complex impedance circuit between the point of measurement and ground which introduces random phase shifts into the phase attribute measurement. Although these phase shifts are seldom large enough to cause an attribute error, they do cause errors in the resultant vector phase.

In the present invention, these phase shifts will be minimal because phase identification instrument 235 is close to the ground and far from the phase conductors. Being close to ground increases its capacitance to ground thus lowering its impedance to ground. Therefore, the inherent phase accuracy of phase identification instrument 235 is increased and any phase error is identical for all three conductor signals because all three signals arrive simultaneously on the same input terminal 290. This increases the precision of the resultant vector phase. Additionally, if ever required for increased precision, phase identification instrument 235 can easily be grounded whereas grounding is not normally possible when attached to an extendo stick.

Although the preferred embodiments of the invention have been illustrated and described in detail, it will be readily apparent to those skilled in the art that various modifications may be made therein without departing from the spirit of the invention. For example, phase identification instrument 235 illustrated in FIG. 26 need not be handheld. In some cases, it may be desirable to mount phase identification instrument 235 on an short hot stick to place it in closer proximity to a particular conductor, or set of conductors, in special construction situations. Some utilities combine three-phase 12.5 KV lines under 69 KV lines (called under build). Placing phase identification instrument 235 closer to the lower 12.5 KV lines would reduce the influence of the higher 69 KV lines, when measuring 12.5 KV phase attributes.

What is claimed is:

1. A method of identifying three-phase conductor phase attributes in a three-phase power distribution network, said method comprising:
    providing a powerline voltage reference phase at a reference location;
    providing a non-contact phase identification instrument at a field location, said instrument configured to capacitive couple to said powerline voltage on each said three-phase conductor;
    positioning said instrument so that distances between said instrument and each said three-phase conductor are in a near, center, far relationship;
    summing said powerline voltage signal from each said three-phase conductor in said instrument to produce a said powerline voltage signal resultant vector;
    measuring said resultant vector phase; and
    identifying said three-phase conductor phase attributes by comparing said resultant vector phase with said reference phase.

2. A method as claimed in claim 1 wherein said comparing for three-phase conductors with ABC phase rotation comprises:
    identifying near, center, far said three-phase conductor phase attributes as ABC if said resultant vector phase lags said reference phase A by less than 60 degrees;
    identifying near, center, far said three-phase conductor phase attributes as ACB if said resultant vector phase leads said reference phase A by less than 60 degrees;
    identifying near, center, far said three-phase conductor phase attributes as CAB if said resultant vector phase lags said reference phase C by less than 60 degrees;
    identifying near, center, far said three-phase conductor phase attributes as CBA if said resultant vector phase leads said reference phase C by less than 60 degrees;
    identifying near, center, far said three-phase conductor phase attributes as BCA if said resultant vector phase lags said reference phase B by less than 60 degrees; and
    identifying near, center, far said three-phase conductor phase attributes as BAC if said resultant vector phase leads said reference phase B by less than 60 degrees.

3. A method as claimed in claim 1 wherein said comparing for three-phase conductors with ACB phase rotation comprises:
    identifying near, center, far said three-phase conductor phase attributes as ACB if said resultant vector phase lags said reference phase A by less than 60 degrees;
    identifying near, center, far said three-phase conductor phase attributes as ABC if said resultant vector phase leads said reference phase A by less than 60 degrees;
    identifying near, center, far said three-phase conductor phase attributes as BAC if said resultant vector phase lags said reference phase B by less than 60 degrees;
    identifying near, center, far said three-phase conductor phase attributes as BCA if said resultant vector phase leads said reference phase B by less than 60 degrees;
    identifying near, center, far said three-phase conductor phase attributes as CBA if said resultant vector phase lags said reference phase C by less than 60 degrees; and
    identifying near, center, far said three-phase conductor phase attributes as CAB if said resultant vector phase leads said reference phase C by less than 60 degrees.

4. A method as claimed in claim 1 wherein said comparing for three-phase conductors with ABC phase rotation when two conductors are present comprises:
    identifying near, far said three-phase conductor phase attributes as AB if said resultant vector phase lags said reference phase A by less than 60 degrees;
    identifying near, far said three-phase conductor phase attributes as AC if said resultant vector phase leads said reference phase A by less than 60 degrees;
    identifying near, far said three-phase conductor phase attributes as CA if said resultant vector phase lags said reference phase C by less than 60 degrees;
    identifying near, far said three-phase conductor phase attributes as CB if said resultant vector phase leads said reference phase C by less than 60 degrees;
    identifying near, far said three-phase conductor phase attributes as BC if said resultant vector phase lags said reference phase B by less than 60 degrees; and
    identifying near, far said three-phase conductor phase attributes as BA if said resultant vector phase leads said reference phase B by less than 60 degrees.

5. A method as claimed in claim 1 wherein said comparing for three-phase conductors with ACB phase rotation when two conductors are present comprises:

identifying near, far said three-phase conductor phase attributes as AC if said resultant vector phase lags said reference phase A by less than 60 degrees;

identifying near, far said three-phase conductor phase attributes as AB if said resultant vector phase leads said reference phase A by less than 60 degrees;

identifying near, far said three-phase conductor phase attributes as BA if said resultant vector phase lags said reference phase C by less than 60 degrees;

identifying near, far said three-phase conductor phase attributes as BC if said resultant vector phase leads said reference phase C by less than 60 degrees;

identifying near, far said three-phase conductor phase attributes as CB if said resultant vector phase lags said reference phase B by less than 60 degrees; and identifying near, far said three-phase conductor phase attributes as CA if said resultant vector phase leads said reference phase B by less than 60 degrees.

6. A method as claimed in claim 1 additionally comprising:

measuring said three-phase conductor phase attributes by positioning said instrument at a first location left of horizontal three-phase conductors;

measuring said three-phase conductor phase attributes by positioning said instrument at a second location right of said horizontal three-phase conductors;

identifying said three-phase conductor near attribute at said first location as near attribute obtained at said first location;

identifying said three-phase conductor far attribute at said first location as near attribute obtained at said second location; and identifying said three-phase conductor center attribute as that attribute not identified for outer said horizontal three-phase conductors.

7. A method as claimed in claim 2 additionally comprising:

measuring said three-phase conductor phase attributes by positioning said instrument at a first location, said first location close to vertical three-phase conductors;

measuring said three-phase conductor phase attributes by positioning said instrument at a second location, said second location further from said vertical three-phase conductors than said first location;

identifying near, center, far said three-phase conductor phase attributes as ACB if said first location attributes obtained were ABC and said second location resultant vector phase leads said first location resultant vector phase;

identifying near, center, far said three-phase conductor phase attributes as ABC if said first location attributes obtained were ACB and said second location resultant vector phase lags said first location resultant vector phase;

identifying near, center, far said three-phase conductor phase attributes as CBA if said first location attributes obtained were CAB and said second location resultant vector phase leads said first location resultant vector phase;

identifying near, center, far said three-phase conductor phase attributes as CAB if said first location attributes obtained were CBA and said second location resultant vector phase lags said first location resultant vector phase;

identifying near, center, far said three-phase conductor phase attributes as BAC if said first location attributes obtained were BCA and said second location resultant vector phase leads said first location resultant vector phase; and identifying near, center, far said three-phase conductor phase attributes as BCA if said first location attributes obtained were BAC and said second location resultant vector phase lags said first location resultant vector phase.

8. A method as claimed in claim 3 additionally comprising:

measuring said three-phase conductor phase attributes by positioning said instrument at a first location, said first location close to vertical three-phase conductors;

measuring said three-phase conductor phase attributes by positioning said instrument at a second location, said second location further from said vertical three-phase conductors than said first location;

identifying near, center, far said three-phase conductor phase attributes as ABC if said first location attributes obtained were ACB and said second location resultant vector phase leads said first location resultant vector phase;

identifying near, center, far said three-phase conductor phase attributes as ACB if said first location attributes obtained were ABC and said second location resultant vector phase lags said first location resultant vector phase;

identifying near, center, far said three-phase conductor phase attributes as BCA if said first location attributes obtained were BAC and said second location resultant vector phase leads said first location resultant vector phase;

identifying near, center, far said three-phase conductor phase attributes as BAC if said first location attributes obtained were BCA and said second location resultant vector phase lags said first location resultant vector phase;

identifying near, center, far said three-phase conductor phase attributes as CAB if said first location attributes obtained were CBA and said second location resultant vector phase leads said first location resultant vector phase; and identifying near, center, far said three-phase conductor phase attributes as CBA if said first location attributes obtained were CAB and said second location resultant vector phase lags said first location resultant vector phase.

9. A method as claimed in claim 1 additionally comprising:

positioning said non-contact phase identification instrument near an isolated single phase conductor with known phase attribute;

measuring said resultant vector phase; and calibrating said non-contact phase identification instrument by adjusting said resultant vector phase to said powerline voltage reference phase.

10. A method as claimed in claim 1 additionally comprising:

positioning said non-contact phase identification instrument near a building power meter or wall socket;

measuring said resultant vector phase; and identifying phase attribute of said three-phase conductor phase attributes supplying power to said meter or to said wall socket.

11. A method as claimed in claim 1 additionally comprising:

finding occurrences of isolated single phase conductors with attributes A, B, and C;

positioning said non-contact phase identification instrument near each said isolated single phase conductors;

measuring said powerline voltage magnitudes for each said isolated single phase conductors;

measuring said resultant vector phase for each said isolated single phase conductors; and calibrating said non-contact phase identification instrument to account for any unequal said powerline voltage magnitudes or for any said resultant vector phase differences not equal to 120 degrees between phase attribute A, B, or C conductors.

12. An apparatus for identifying three-phase conductor phases in a three-phase power distribution network, said apparatus comprises:

a base station at a reference location, said base station configured to provide a powerline voltage reference phase;

a non-contact field probe at a field location, said field probe configured to capacitive couple to said powerline voltage signal on each said three-phase conductor to form a said powerline voltage signal resultant vector;

a circuit within said field probe, said circuit configured to measure said resultant vector phase; and computing means to determine said three-phase conductor phases by comparing said resultant vector phase with said reference phase.

13. An apparatus as in claim 12 wherein said non-contact field probe further comprises a movable shield, said movable shield configured to partially shield said non-contact field probe from one or more said three-phase conductor.

14. An apparatus as in claim 12 wherein said field probe comprises:

an input terminal configured to capacitive couple to said three-phase conductor phases;

an amplifier configured to amplify said resultant vector formed on said input terminal; and a circuit block configured to measure said resultant vector phase and communicate said resultant vector phase to a user or other computing equipment.

15. An apparatus as in claim 14 wherein said amplifier provides high dynamic range gain with low phase shift.

16. An apparatus as in claim 14 wherein said amplifier is configured as a hard limiter.

17. An apparatus as in claim 12 wherein said non-contact field probe is handheld.

18. A method of identifying a three-phase conductor phase in a three-phase power distribution network, said method comprising:

providing a powerline voltage reference phase at a reference location;

providing a non-contact phase identification instrument at a field location, said instrument configured to capacitive couple to said powerline voltage signal on said three-phase conductor;

positioning said instrument close to a particular said three-phase conductor, said particular three-phase conductor nearer to said instrument than any other said three-phase conductor;

measuring said powerline voltage signal phase using said instrument; and identifying said particular three-phase conductor phase by comparing said powerline voltage signal phase with said reference phase.

19. A method as claimed in claim 18 additionally comprising:

positioning said instrument at a first location, said first location on one side of horizontal three-phase conductors;

identifying said first location nearest horizontal conductor phase;

positioning said instrument at a second location, said second location on opposite side of said horizontal three-phase conductors;

identifying said second location nearest horizontal conductor phase; and identifying center conductor phase as phase not identified at said first location or said second location.

20. A method as claimed in claim 18 additionally comprising:

positioning said instrument at a first location, said first location under offset vertical three-phase conductors;

identifying bottom conductor phase of said offset vertical three-phase conductors;

positioning said instrument at a second location, said second location a sufficient distance from said offset vertical three-phase conductors so that center conductor is nearest conductor to said instrument;

identifying said center conductor phase of said offset vertical three-phase conductors; and identifying top conductor phase of said offset vertical three-phase conductors as that phase not measured for said bottom conductor or for said center conductor.

* * * * *